United States Patent
Liu et al.

(10) Patent No.: US 8,614,584 B2
(45) Date of Patent: Dec. 24, 2013

(54) SYSTEM AND METHOD FOR BONDED CONFIGURATION PAD CONTINUITY CHECK

(75) Inventors: Baojing Liu, San Jose, CA (US); Aruna Gutta, San Jose, CA (US); Stephen Skala, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 467 days.

(21) Appl. No.: 13/039,110

(22) Filed: Mar. 2, 2011

(65) Prior Publication Data

US 2012/0223721 A1 Sep. 6, 2012

(51) Int. Cl.
*G01R 31/02* (2006.01)
*G01R 31/26* (2006.01)
(52) U.S. Cl.
USPC ..................... 324/537; 324/762.03
(58) Field of Classification Search
USPC .......... 324/537, 500, 756.03–756.05, 756.07, 324/757.02–757.04, 762.01–762.05, 763.01
See application file for complete search history.

(56) References Cited

U.S. PATENT DOCUMENTS

| | | | |
|---|---|---|---|
| 6,351,836 B1 * | 2/2002 | Tsujii | 714/727 |
| 7,279,921 B1 * | 10/2007 | Iacob | 324/762.03 |
| 2008/0290341 A1 | 11/2008 | Shibata | |
| 2009/0027059 A1 | 1/2009 | Arguello | |
| 2009/0066362 A1 | 3/2009 | Akahori | |

* cited by examiner

*Primary Examiner* — Hoai-An D Nguyen
(74) *Attorney, Agent, or Firm* — Martine Penilla Group, LLP

(57) ABSTRACT

A continuity test circuit for a boundary pad includes a pull-up transistor electrically connected between the boundary pad and a first power supply, and a pull-down transistor electrically connected between the boundary pad and a first reference ground potential. A normal output conductor is electrically connected to have a same electrical state as the boundary pad during normal operation. A continuity test output conductor is electrically connected to have a same electrical state as the boundary pad during continuity test operation. Continuity testing control circuitry is defined to control the pull-up transistor, the pull-down transistor, and the normal output conductor during continuity test operation such that an electrical state present on the continuity test output conductor indicates a status of electrical continuity between the boundary pad and either a second power supply or a second reference ground potential to which the boundary pad should be electrically connected.

26 Claims, 9 Drawing Sheets

SYSTEM AND METHOD FOR BONDED CONFIGURATION PAD CONTINUITY CHECK

BACKGROUND

Non-volatile semiconductor memory devices, such as flash memory cards and the like, have become an essential component for digital information storage in modern electronic devices. In particular, modern portable electronic devices benefit greatly from the high-capacity, versatility, ruggedness, and power utilization efficiency afforded by semiconductor memory devices. Such modern portable electronic devices may include, by way of example, digital cameras, digital music players, smart phones, video game consoles, portable computing devices, among others.

Flash memory storage cards may be fabricated as a system-in-a-package (SIP) or as a multichip module (MCM), in which multiple semiconductor die are mounted and interconnected on a substrate. The substrate may include a rigid, dielectric base with a conductive layer etched on one or both sides. The die are electrically connected to the conductive layer(s) of the substrate. In turn, the conductive layer(s) of the substrate provide for electrical connection of the die to a host electronic device. Following electrical connection of the die to the conductive layer(s) of the substrate, the die/substrate assembly may be encased in a protective material, which also assists in holding the die and substrate together.

Connection of the die to the substrate can include connection of electrically conductive pads on the die to wire bonds on the substrate. The connections between the pads of the die and the wire bonds of the substrate are often inaccessible for continuity testing once the die is placed on the substrate, and especially after the die and substrate are encased in the protective material. For product testing purposes, it is desirable to have an ability to test the electrical continuity between each pad of the die and the corresponding wire bond of the substrate to which the pad should be electrically connected. It is within this context that the present invention arises.

SUMMARY

In one embodiment, a continuity test circuit for a boundary pad is disclosed. The continuity test circuit includes a pull-up transistor electrically connected between the boundary pad and a first power supply. The continuity test circuit also includes a pull-down transistor electrically connected between the boundary pad and a first reference ground potential. The continuity test circuit also includes a normal output conductor electrically connected to have a same electrical state as the boundary pad during normal operation. The continuity test circuit also includes a continuity test output conductor electrically connected to have a same electrical state as the boundary pad during continuity test operation. Additionally, the continuity test circuit includes continuity testing control circuitry defined to control the pull-up transistor, the pull-down transistor, and the normal output conductor during continuity test operation, such that an electrical state present on the continuity test output conductor indicates a status of electrical continuity between the boundary pad and either a second power supply or a second reference ground potential to which the boundary pad should be electrically connected.

In one embodiment, a memory system is disclosed to include a substrate and a die. The substrate includes a number of wire bonds. The die includes a number of boundary pads. The die is secured to the substrate such that the number of boundary pads are electrically and respectively connected to the number of wire bonds. The die also includes continuity test circuitry for each boundary pad. The continuity test circuitry for a given boundary pad is defined to enable firmware controlled testing of electrical continuity between the given boundary pad and its wire bond.

In one embodiment, a method is disclosed for testing electrical continuity between a boundary pad and a wire bond. The method includes an operation for determining whether the wire bond is electrically connected to either an energized power supply or a reference ground potential. If the wire bond is connected to the energized power supply, the method proceeds with a first set of operations. The first set of operation include turning off a pull-up transistor connected to the boundary pad, and turning on a pull-down transistor connected to the boundary pad. The first set of operations also include observing a signal present at the boundary pad to determine whether the signal represents a high digital state or a low digital state. If the wire bond is connected to the energized power supply, the high digital state indicates electrical continuity between the boundary pad and the wire bond, and the low digital state indicates an absence of electrical continuity between the boundary pad and the wire bond. If the wire bond is connected to the reference ground potential, the method proceeds with a second set of operations. The second set of operations include turning on the pull-up transistor connected to the boundary pad, and turning off the pull-down transistor connected to the boundary pad. The second set of operations also include observing the signal present at the boundary pad to determine whether the signal represents the high digital state or the low digital state. If the wire bond is connected to the reference ground potential, the low digital state indicates electrical continuity between the boundary pad and the wire bond, and the high digital state indicates an absence of electrical continuity between the boundary pad and the wire bond.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
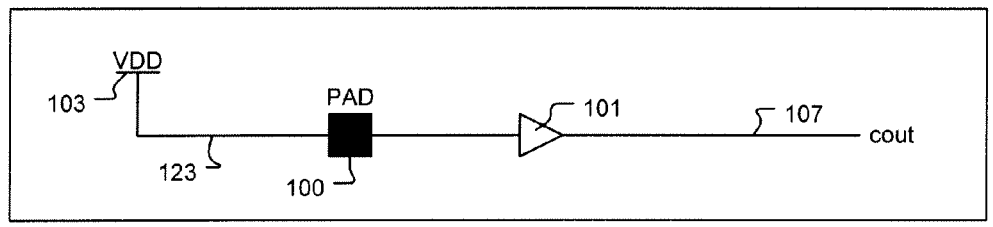
FIGS. 1A and 1B show conventional boundary pad configurations that may occur on a die.
Figure 1B:
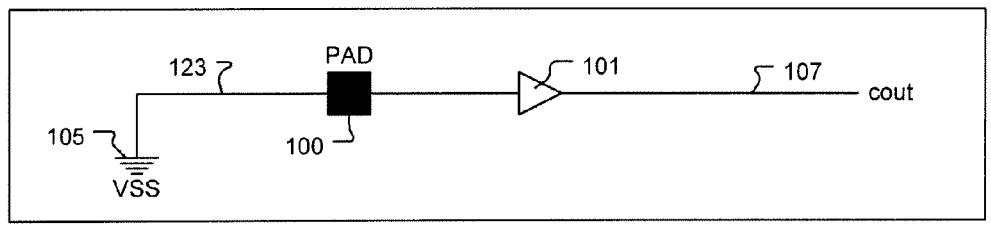

FIGS. 1A and 1B show conventional boundary pad configurations that may occur on a die. In FIG. 1A, the boundary pad 100 is electrically connected to a power supply 103 by way of a wire bond 123. The boundary pad 100 is also electrically connected to a buffer 101. The output of the buffer 101 is connected to a normal output conductor 107, along which an electrical signal (cout) may be transmitted from the boundary pad 100 to other circuitry on the die, such as core logic circuitry. In FIG. 1B, the boundary pad 100 is also connected to the buffer 101, which is in turn connected to the normal output conductor 107. However, in FIG. 1B, the boundary pad 100 is electrically connected to a reference ground potential 105 by way of a wire bond 123.

Figure 1C:
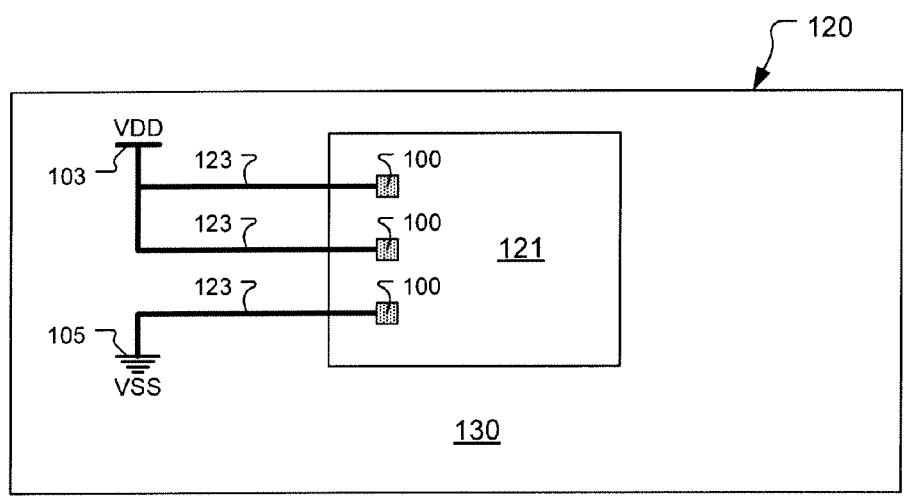
FIG. 1C shows a memory system that includes a die connected to a substrate.

FIG. 1C shows a memory system 120 that includes a die 121 connected to a substrate 130. The die 121 includes a number of boundary pads 100, such as described with regard to FIGS. 1A and 1B. When the die 121 is connected to the substrate 130, each boundary pad 100 is supposed to be electrically connected to a corresponding wire bond 123 present on the substrate 130. Each wire bond 123 is connected to either the power supply 103 or the reference ground potential 105. In some embodiments, the boundary pads 100 are not physically accessible after the die 121 is connected to the substrate 130. In these embodiments, it is not possible to visually inspect the electrical continuity between the boundary pad 100 and its wire bond 123. Also, it is not physically possible to probe between the die 121 and the substrate 130 after the die 121 is connected to the substrate 130. Therefore, the boundary pads 100 cannot be physically probed to confirm electrical continuity with their wire bonds 123. Therefore, a solution is needed to provide for testing of electrical continuity between the boundary pad 100 and its wire bond 123, after the die 121 is connected to the substrate 130.

Figure 2A:
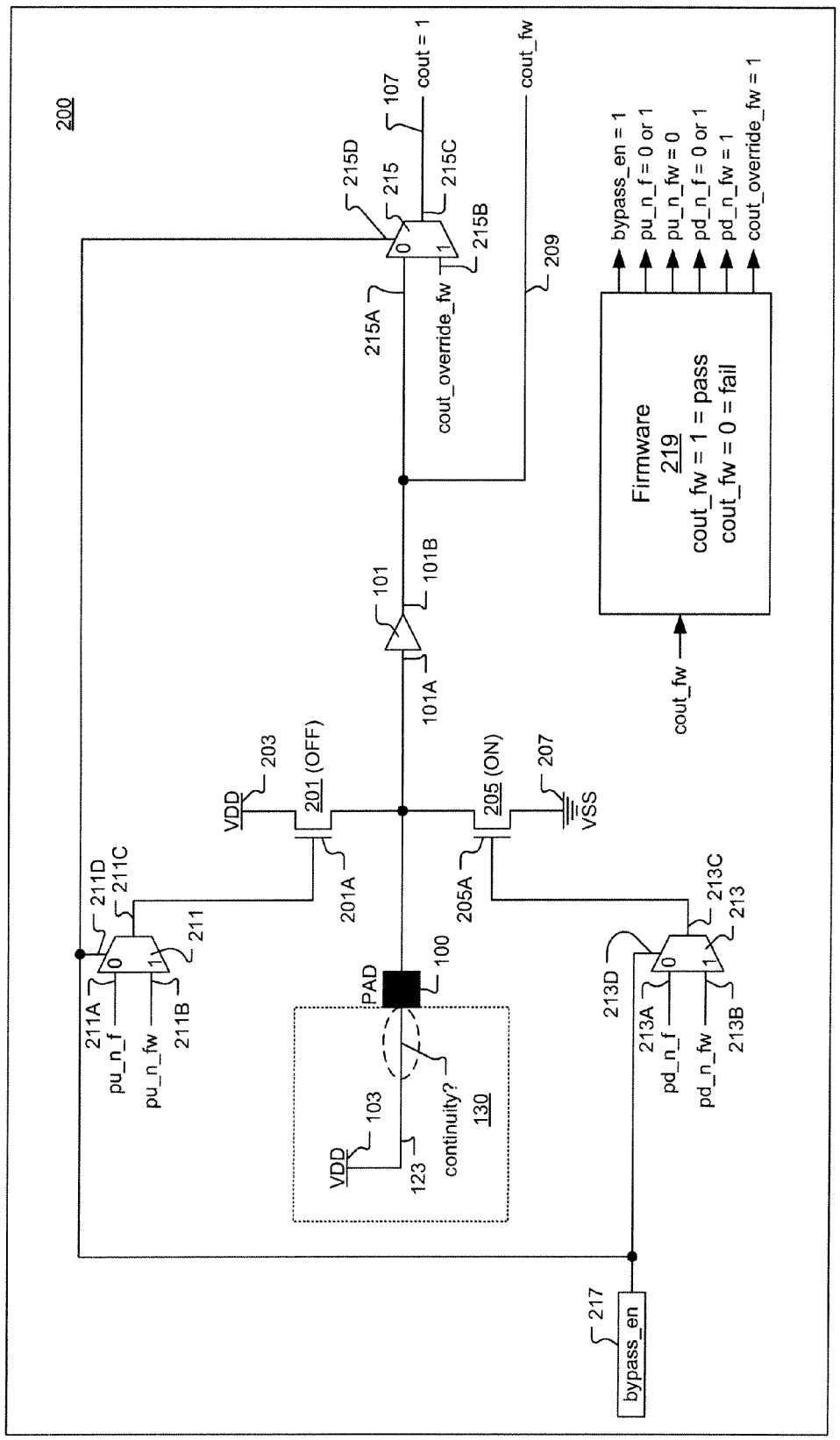
FIG. 2A shows a continuity test circuit for a boundary pad, in accordance with one embodiment of the present invention.

FIG. 2A shows a continuity test circuit for a boundary pad 100, in accordance with one embodiment of the present invention. The continuity test circuit includes a pull-up transistor 201 that is electrically connected between the boundary pad 100 and a first power supply 203. The boundary pad 100 is electrically connected through the pull-up transistor 201 to the first power supply 203 when the pull-up transistor 201 is on. The boundary pad 100 is electrically isolated from the first power supply 203 by the pull-up transistor 201 when the pull-up transistor 201 is off. The continuity test circuit also includes a pull-down transistor 205 that is electrically connected between the boundary pad 100 and a first reference ground potential 207. The boundary pad 100 is electrically connected through the pull-down transistor 205 to the first reference ground potential 207 when the pull-down transistor 205 is on. The boundary pad 100 is electrically isolated from the first reference ground potential 207 by the pull-down transistor 205 when the pull-down transistor 205 is off. It should be understood that the pull-up transistor 210, the pull-down transistor 205, the first power supply 203, and the first reference ground potential 207 are defined within a die 200.

The continuity test circuit also includes the normal output conductor 107 electrically connected to have a same electrical state as the boundary pad 100 during normal operation, as discussed in more detail below. The continuity test circuit further includes a continuity test output conductor 209 electrically connected to have a same electrical state as the boundary pad 100 during continuity test operation. In one embodiment, the normal output conductor 107 and the continuity test output conductor 109 are both electrically connected to the boundary pad 100 through a buffer 101. More specifically, the buffer 100 has an input 101A electrically connected to the boundary pad 100, and an output 101B electrically connected to the continuity test output conductor 109. As discussed in more detail below, an electrical signal present at the output 101B of the buffer 101 is transmitted to the normal output conductor 107 under the direction of an output control multiplexer 215, during normal operation.

Figure 3A:
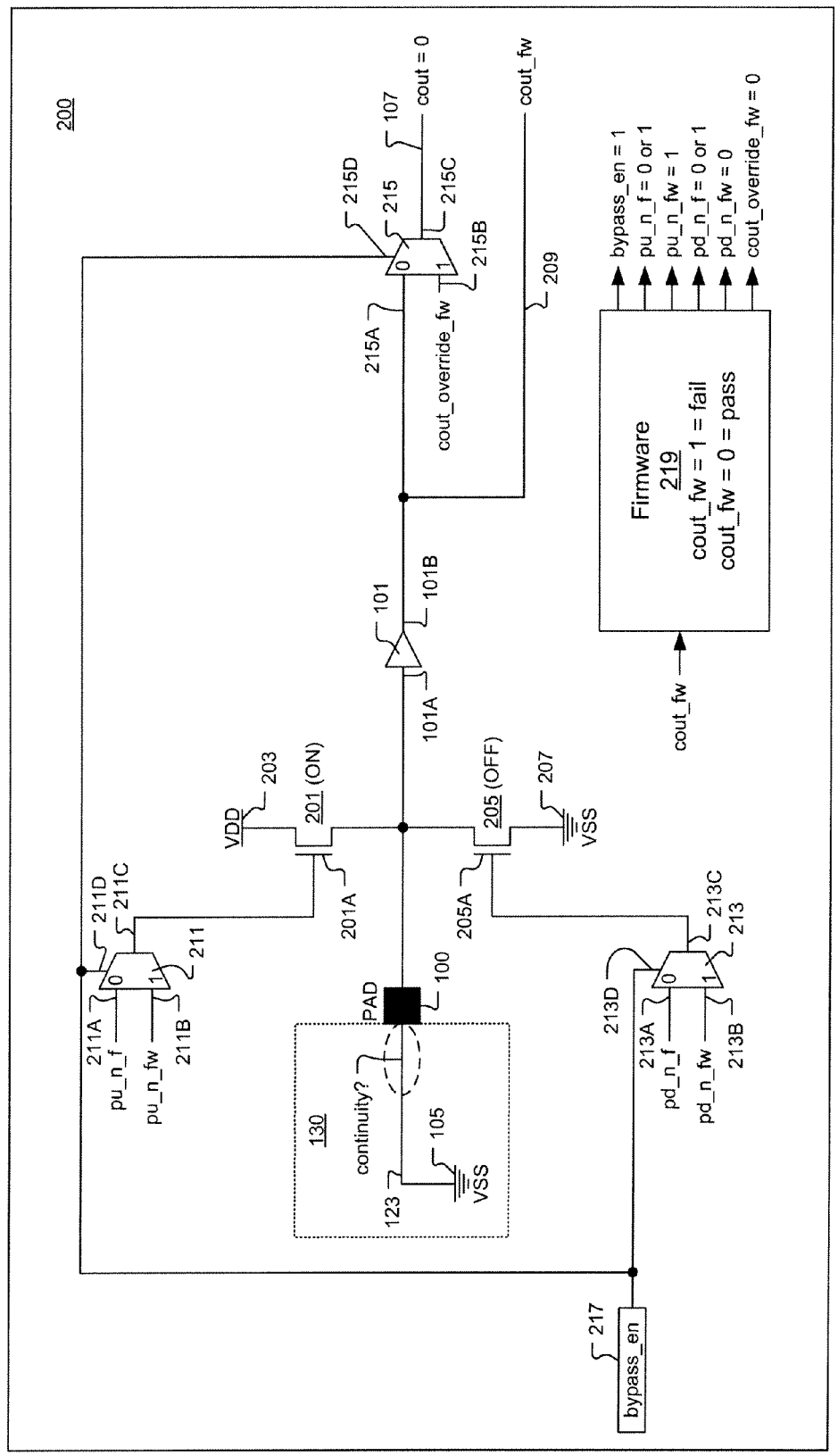
FIG. 3A shows the continuity test circuitry of FIG. 2A, with the boundary pad on the die electrically connected to the second reference ground potential on the substrate, in accordance with one embodiment of the present invention.

The continuity test circuit also includes continuity testing control circuitry defined to control the pull-up transistor 201, the pull-down transistor 205, and the normal output conductor 107 during continuity test operation such that an electrical state present on the continuity test output conductor 209 indicates a status of electrical continuity between the boundary pad 100 and either a second power supply 103 or a second reference ground potential 105 to which the boundary pad 100 should be electrically connected. FIG. 3A shows the case where the boundary pad 100 is electrically connected to the second reference ground potential 105.

It should be understood that the boundary pad 100 is physically connected to a wire bond 123 to establish the electrical continuity between the boundary pad 100 and either the second power supply 103 or the second reference ground potential 105, as the case may be. Therefore, for the boundary pad 100 connected to the second power supply 103, electrical continuity between the boundary pad 100 and the second power supply 103 is indicative of whether or not the boundary pad 100 is physically connected to its wire bond 123. And, for the boundary pad 100 connected to the second reference ground potential 105, electrical continuity between the boundary pad 100 and the second reference ground potential 105 is indicative of whether or not the boundary pad 100 is physically connected to its wire bond 123.

It should be understood that the wire bond 123, second power supply 103, and second reference ground potential 105 are defined within the substrate 130 to which the die 200 is connected. In one embodiment, the first power supply 203 and the second power supply 103 are equivalent. In another embodiment, the first power supply 203 and the second power supply 103 are different. In one embodiment, the first reference ground potential 207 and the second reference ground potential 105 are equivalent. In another embodiment, the first reference ground potential 207 and the second reference ground potential 105 are different.

The continuity testing control circuitry includes a pull-up control multiplexer 211 defined to control a gate 201A of the pull-up transistor 201, in accordance with an operation control signal (bypass_en). The pull-up control multiplexer 211 is defined to include a select input 211D electrically connected to a continuity testing enable register 217 in which the operation control signal (bypass_en) is set. The operation control signal (bypass_en) is set within the continuity testing enable register 217 to indicate either a normal operation mode or a continuity test operation mode. In one embodiment, the operation control signal (bypass_en) is set within the continuity testing enable register 217 through firmware 219. The pull-up control multiplexer 211 is also defined to have a first input 211A connected to receive a pull-up transistor normal control signal (pu_n_f). The pull-up control multiplexer 211 is defined to have a second input 211B connected to receive a pull-up transistor test control signal (pu_n_fw). The pull-up control multiplexer 211 further includes an output 211C electrically connected to the gate 201A of the pull-up transistor 201.

When the operation control signal (bypass_en) indicates normal operation mode, the pull-up transistor normal control signal (pu_n_f) is transmitted by the pull-up control multiplexer 211 to the gate 201A of the pull-up transistor 201. The pull-up transistor normal control signal (pu_n_f) is generated through the firmware 219, and may correspond to either a high digital state signal (1) or a low digital state signal (0), depending on the normal operation requirements associated with the boundary pad 100.

When the operation control signal (bypass_en) indicates continuity test operation mode, the pull-up transistor test control signal (pu_n_fw) is transmitted by the pull-up control multiplexer 211 to the gate 201A of the pull-up transistor 201. The pull-up transistor test control signal (pu_n_fw) is generated through the firmware 219, and may correspond to either a high digital state signal (1) or a low digital state signal (0), depending on whether the boundary pad 100 is supposed to connect to the second power supply 103 or to the second reference ground potential 105.

Specifically, when the boundary pad 100 is supposed to connect to the second power supply 103, as shown in FIG. 2A, the firmware 219 operates to set the pull-up transistor test control signal (pu_n_fw) to the low digital state signal (0), such that the pull-up transistor 201 will be turned off when the operation control signal (bypass_en) causes the pull-up transistor test control signal (pu_n_fw) to be transmitted through the pull-up control multiplexer 211 to the gate 201A of the pull-up transistor 201. Alternatively, when the boundary pad 100 is supposed to connect to the second reference ground potential 105, as shown in FIG. 3A, the firmware 219 operates to set the pull-up transistor test control signal (pu_n_fw) to the high digital state signal (1), such that the pull-up transistor 201 will be turned on when the operation control signal (bypass_en) causes the pull-up transistor test control signal (pu_n_fw) to be transmitted through the pull-up control multiplexer 211 to the gate 201A of the pull-up transistor 201.

The continuity testing control circuitry also includes a pull-down control multiplexer 213 defined to control a gate 205A of the pull-down transistor 205, in accordance with the operation control signal (bypass_en). The pull-down control multiplexer 213 is defined to include a select input 213D electrically connected to the continuity testing enable register 217 in which the operation control signal (bypass_en) is set. The pull-down control multiplexer 213 is also defined to have a first input 213A connected to receive a pull-down transistor normal control signal (pd_n_f). The pull-down control multiplexer 213 is defined to have a second input 213B connected to receive a pull-down transistor test control signal (pd_n_fw). The pull-down control multiplexer 213 further includes an output 213C electrically connected to the gate 205A of the pull-down transistor 205.

When the operation control signal (bypass_en) indicates normal operation mode, the pull-down transistor normal control signal (pd_n_f) is transmitted by the pull-down control multiplexer 213 to the gate 205A of the pull-down transistor 205. The pull-down transistor normal control signal (pd_n_f) is generated through the firmware 219, and may correspond to either a high digital state signal (1) or a low digital state signal (0), depending on the normal operation requirements associated with the boundary pad 100.

When the operation control signal (bypass_en) indicates continuity test operation mode, the pull-down transistor test control signal (pd_n_fw) is transmitted by the pull-down control multiplexer 213 to the gate 205A of the pull-down transistor 205. The pull-down transistor test control signal (pd_n_fw) is generated through the firmware 219, and may correspond to either a high digital state signal (1) or a low digital state signal (0), depending on whether the boundary pad 100 is supposed to connect to the second power supply 103 or to the second reference ground potential 105.

Specifically, when the boundary pad 100 is supposed to connect to the second power supply 103, as shown in FIG. 2A, the firmware 219 operates to set the pull-down transistor test control signal (pd_n_fw) to the high digital state signal (1), such that the pull-down transistor 205 will be turned on when the operation control signal (bypass_en) causes the pull-down transistor test control signal (pd fw) to be transmitted through the pull-down control multiplexer 213 to the gate 205A of the pull-down transistor 205. Alternatively, when the boundary pad 100 is supposed to connect to the second reference ground potential 105, as shown in FIG. 3A, the firmware 219 operates to set the pull-down transistor test control signal (pd_n_fw) to the low digital state signal (0), such that the pull-down transistor 205 will be turned off when the operation control signal (bypass_en) causes the pull-down transistor test control signal (pd_n_fw) to be transmitted through the pull-down control multiplexer 213 to the gate 205A of the pull-down transistor 205.

The continuity testing control circuitry also includes the output control multiplexer 215 defined to persist a normal operation output signal (cout) to the normal output conductor 107, in accordance with the operation control signal (bypass_en). The output control multiplexer 215 is defined to include a select input 215D electrically connected to the continuity testing enable register 217 in which the operation control signal (bypass_en) is set. The output control multiplexer 215 is also defined to have a first input 215A connected to receive the electrical state present at the boundary pad 100. More specifically, the first input 215A of the output control multiplexer 215 is electrically connected to the output 101B of the buffer 101. Because the output of the buffer 101 is an amplified version of the signal present at the boundary pad 100, the first input 215A of the output control multiplexer 215 is connected to receive the electrical state present at the boundary pad 100. The output control multiplexer 215 is also defined to have a second input 215B connected to receive an output override signal (cout_override_fw).

The output control multiplexer 215 also includes an output 215C that is electrically connected to the normal output conductor 107. The output control multiplexer 215 is defined such that when the operation control signal (bypass_en) indicates normal operation mode, the electrical state present at the first input 215A of the output control multiplexer 215 is transmitted by the output control multiplexer 215 to the normal output conductor 107. Therefore, when the operation control signal (bypass_en) indicates normal operation mode, the electrical state present at the boundary pad 100 is transmitted through the output control multiplexer 215 to the normal output conductor 107.

When the operation control signal (bypass_en) indicates continuity test operation mode, the output override signal (cout_override_fw) is transmitted by the output control multiplexer 215 to the normal output conductor 107. The output override signal (cout_override_fw) is used to persist an expected normal operation output signal (cout) to the normal output conductor 107 during the continuity test operation mode. In this manner, any electrical state change at the boundary pad 100 during performance of the continuity testing will be hidden from other circuitry connected to receive the normal operation output signal (cout) from the boundary pad 100. Therefore, continuity testing on the boundary pad 100, as disclosed herein, can be performed without any potential disruption of the normal operation output signal (cout) expected by other circuitry, e.g., core circuitry, connected to the boundary pad 100.

The output override signal (cout_override_fw) is generated through the firmware 219. When the boundary pad 100 is supposed to be connected to the second power supply 103, the output override signal (cout_override_fw) is set to indicate a high digital state (1). When the boundary pad 100 is supposed to be connected to the second reference ground potential 105, the output override signal (cout_override_fw) is set to indicate a low digital state (0). Therefore, by way of the output override signal (cout_override_fw) and the output control multiplexer 215, a correct electrical signal is provided at the normal output conductor 107 during the continuity test operation mode.

FIG. 2A shows the continuity test circuit for the boundary pad 100 on the die 200, in which the boundary pad 100 is supposed to be electrically connected to the second power supply 103 on the substrate 130, in accordance with one embodiment of the present invention. The continuity test circuit provides for testing of the electrical continuity between the boundary pad 100 on the die 200 and the wire bond 123 on the substrate 130. In one embodiment, the operation control signal (bypass_en) is set to a high digital state (1) to enter the continuity test operation mode. It should be understood that in another embodiment with reversed inputs on each of the pull-up control multiplexer 211, pull-down control multiplexer 213, and output control multiplexer 215, the operation control signal (bypass_en) could be set to a low digital state (0) to enter the continuity test operation mode. For ease of discussion, operation of the continuity test circuit is described herein with regard to the arrangement shown in FIG. 2A, in which the high digital state (1) of the operation control signal (bypass_en) triggers the continuity test operation mode.

As shown in FIG. 2A, for continuity testing between the boundary pad 100 and the second power supply 103, the following settings are implemented through operation of the firmware 219:

the operation control signal (bypass_en) is set to the high digital state (1),
the pull-up transistor test control signal (pu_n_fw) is set to the low digital state signal (0), thereby turning off the pull-up transistor 201,
the pull-down transistor test control signal (pd_n_fw) is set to the high digital state signal (1), thereby turning on the pull-down transistor 207,
the output override signal (cout_override_fw) is set to the high digital state (1) that is expected to be present at the boundary pad 100.

Figure 2B:
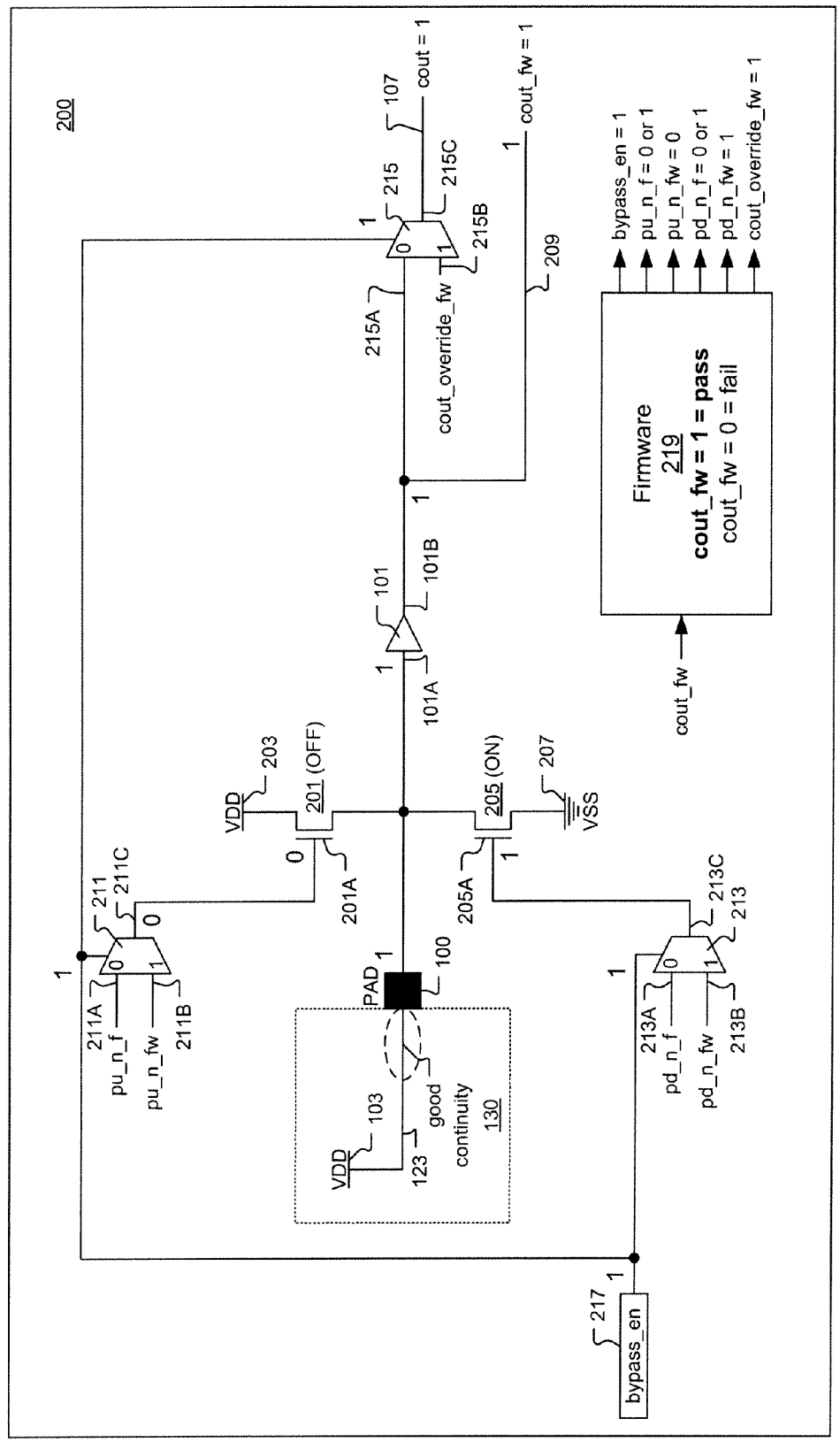
FIG. 2B shows the digital states present within the continuity test circuit of FIG. 2A when the continuity test is performed and electrical continuity does exist between the boundary pad and the wire bond to which the second power supply is connected, in accordance with one embodiment of the present invention.

With the above settings implemented, the electrical signal present at the continuity test output conductor 209, i.e., the continuity test output signal (cout_fw), is observed to determine whether or not electrical continuity is established between the boundary pad 100 and the second power supply 103. More specifically, for testing electrical continuity between the boundary pad 100 and the second power supply 103, if the continuity test output signal (cout_fw) corresponds to a high digital state (1), electrical continuity does exist between the boundary pad 100 and the wire bond 123 to which the second power supply 103 is connected. FIG. 2B shows the digital states present within the continuity test circuit of FIG. 2A when the continuity test is performed and electrical continuity does exist between the boundary pad 100 and the wire bond 123 to which the second power supply 103 is connected, in accordance with one embodiment of the present invention.

Figure 2C:
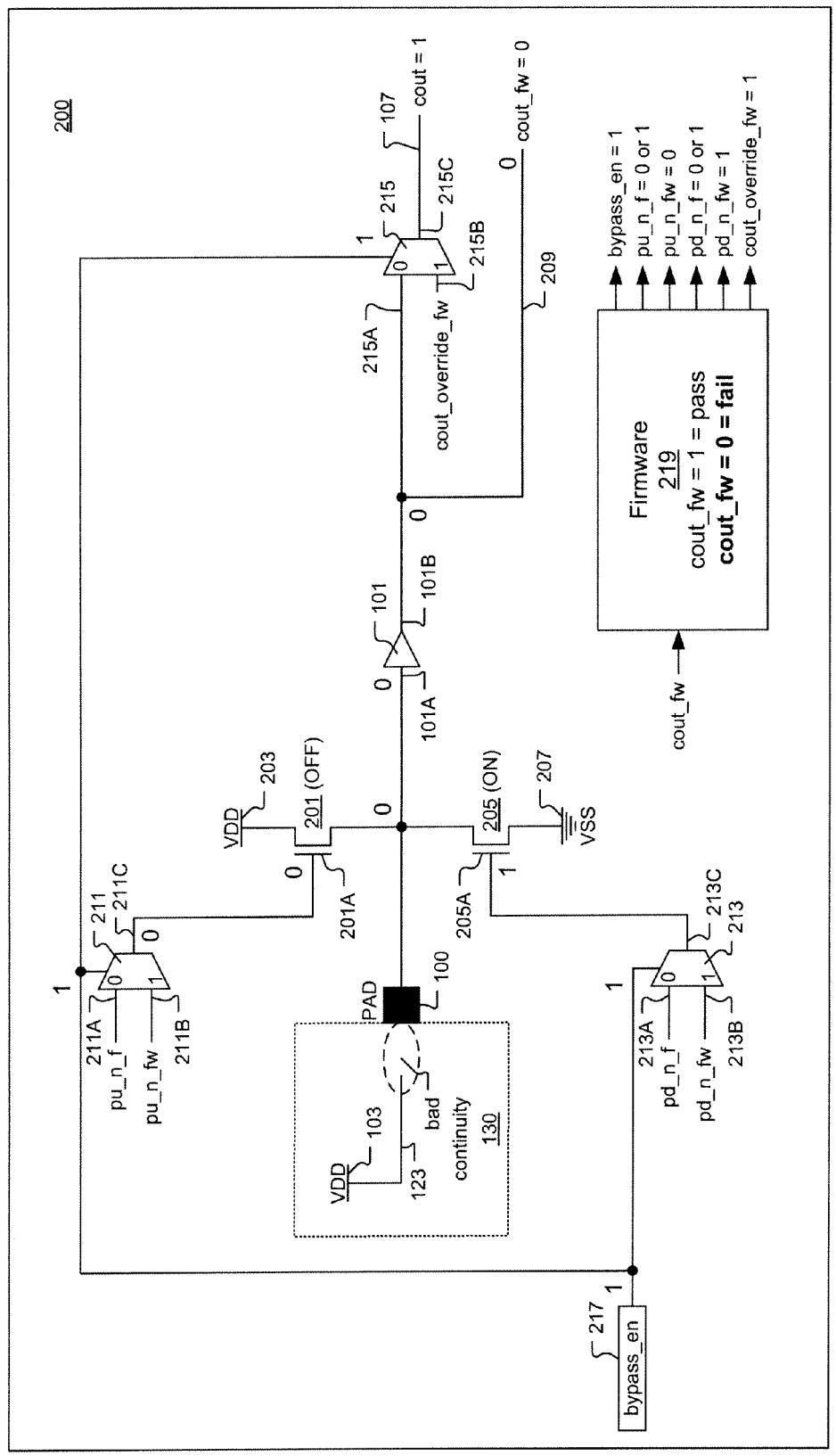
FIG. 2C shows the digital states present within the continuity test circuit of FIG. 2A when the continuity test is performed and electrical continuity does not exist between the boundary pad and the wire bond to which the second power supply is connected, in accordance with one embodiment of the present invention.

Also, for testing electrical continuity between the boundary pad 100 and the second power supply 103, if the continuity test output signal (cout_fw) corresponds to a low digital state (0), electrical continuity does not exist between the boundary pad 100 and the wire bond 123 to which the second power supply 103 is connected. FIG. 2C shows the digital states present within the continuity test circuit of FIG. 2A when the continuity test is performed and electrical continuity does not exist between the boundary pad 100 and the wire bond 123 to which the second power supply 103 is connected, in accordance with one embodiment of the present invention.

FIG. 3A shows the continuity test circuitry of FIG. 2A, with the boundary pad 100 on the die 200 electrically connected to the second reference ground potential 105 on the substrate 130, in accordance with one embodiment of the present invention. As shown in FIG. 3A, for continuity testing between the boundary pad 100 and the second reference ground potential 105, the following settings are implemented through operation of the firmware 219:

the operation control signal (bypass_en) is set to the high digital state (1),
the pull-up transistor test control signal (pu_n_fw) is set to the high digital state signal (1), thereby turning on the pull-up transistor 201,
the pull-down transistor test control signal (pd_n_fw) is set to the low digital state signal (0), thereby turning off the pull-down transistor 207,
the output override signal (cout_override_fw) is set to the low digital state (0) that is expected to be present at the boundary pad 100.

Figure 3B:
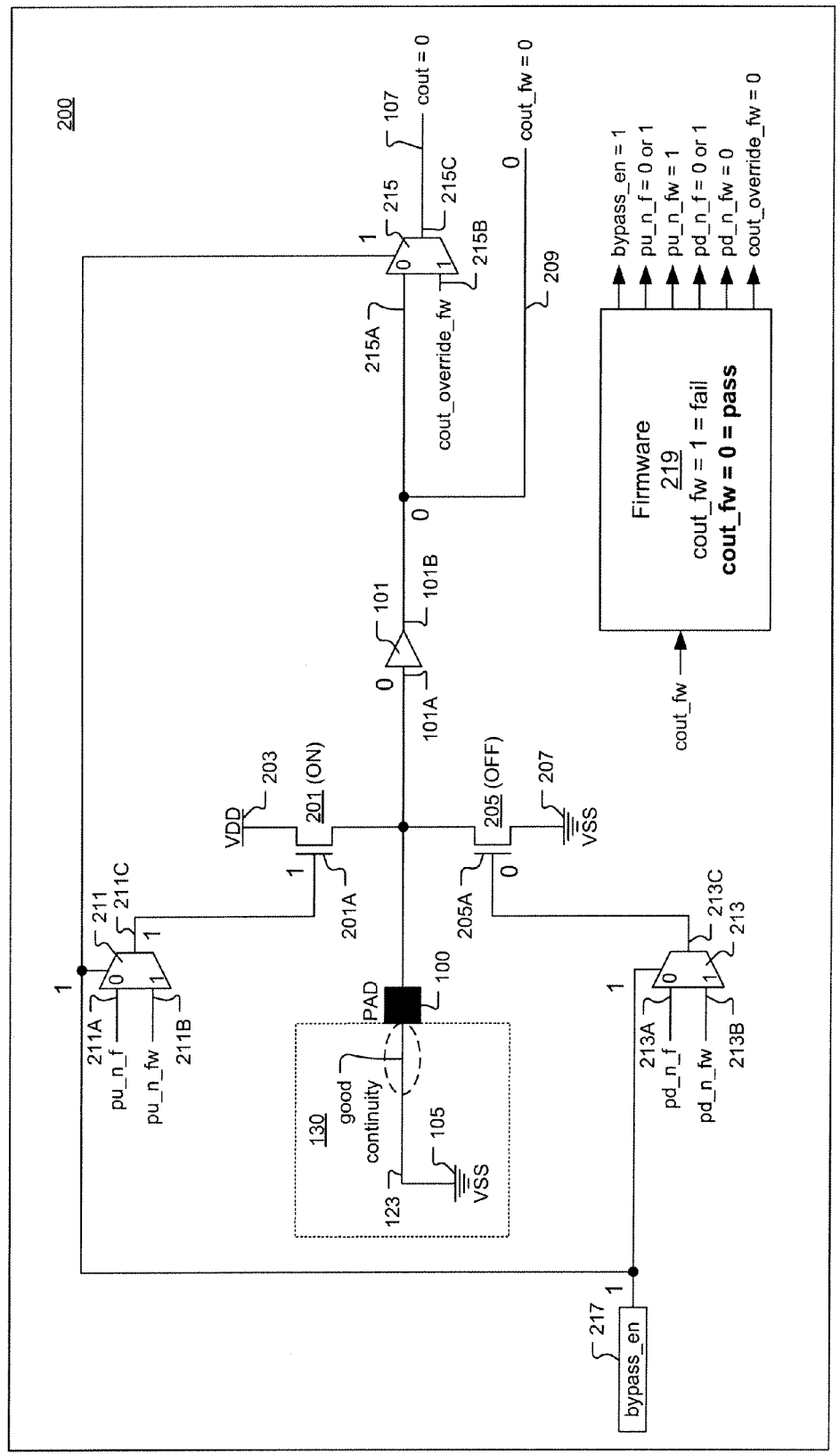
FIG. 3B shows the digital states present within the continuity test circuit of FIG. 3A when the continuity test is performed and electrical continuity does exist between the boundary pad and the wire bond to which the second reference ground potential is connected, in accordance with one embodiment of the present invention.

With the above settings implemented, the electrical signal present at the continuity test output conductor 209, i.e., the continuity test output signal (cout_fw), is observed to determine whether or not electrical continuity is established between the boundary pad 100 and the second reference ground potential 105. More specifically, for testing electrical continuity between the boundary pad 100 and the second reference ground potential 105, if the continuity test output signal (cout_fw) corresponds to a low digital state (0), electrical continuity does exist between the boundary pad 100 and the wire bond 123 to which the second reference ground potential 105 is connected. FIG. 3B shows the digital states present within the continuity test circuit of FIG. 3A when the continuity test is performed and electrical continuity does exist between the boundary pad 100 and the wire bond 123 to which the second reference ground potential 105 is connected, in accordance with one embodiment of the present invention.

Figure 3C:
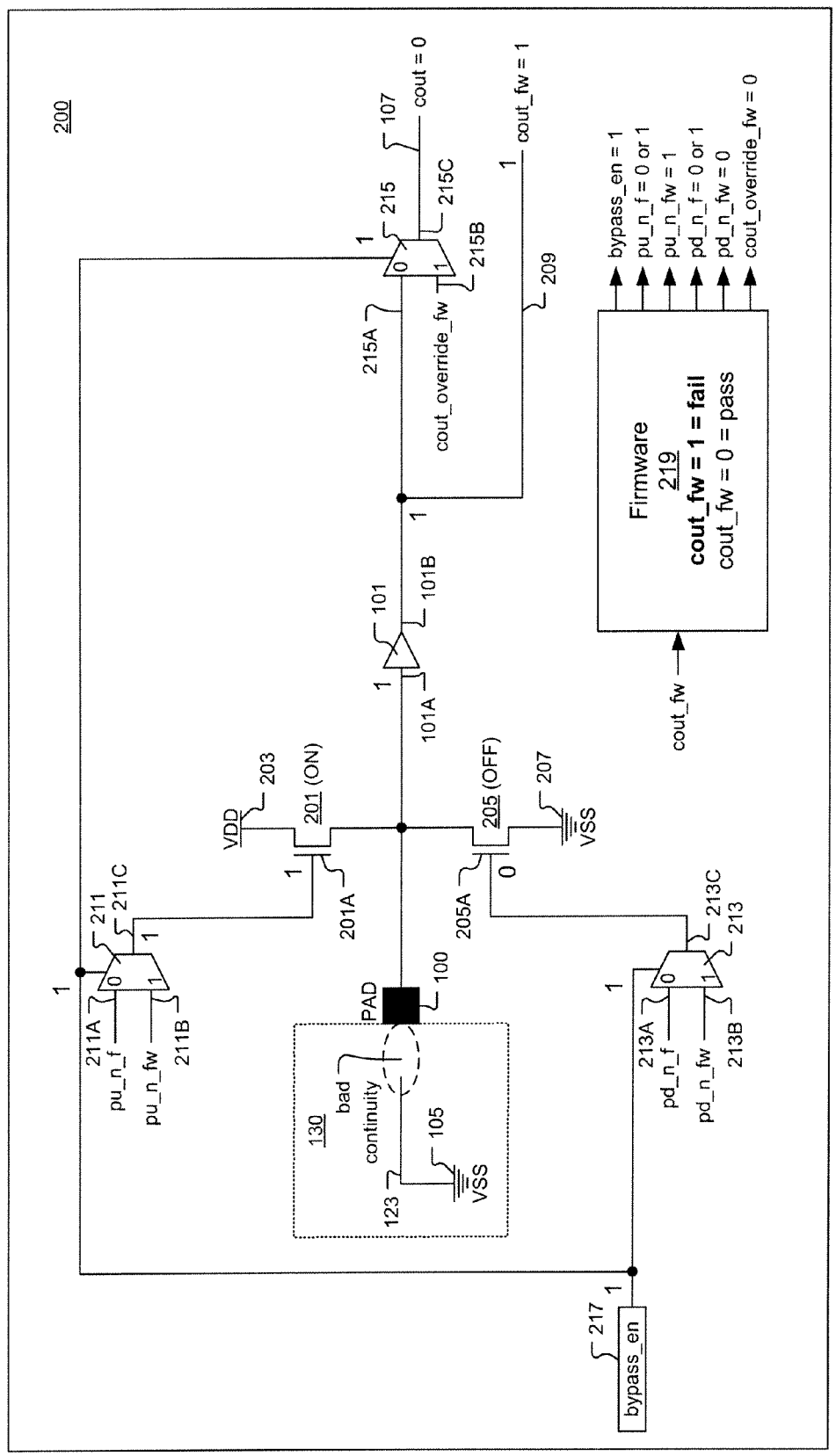
FIG. 3C shows the digital states present within the continuity test circuit of FIG. 3A when the continuity test is performed and electrical continuity does not exist between the boundary pad and the wire bond to which the second reference ground potential is connected, in accordance with one embodiment of the present invention.

Also, for testing electrical continuity between the boundary pad 100 and the second reference ground potential 105, if the continuity test output signal (cout_fw) corresponds to a high digital state (1), electrical continuity does not exist between the boundary pad 100 and the wire bond 123 to which the second reference ground potential 105 is connected. FIG. 3C shows the digital states present within the continuity test circuit of FIG. 3A when the continuity test is performed and electrical continuity does not exist between the boundary pad 100 and the wire bond 123 to which the second reference ground potential 105 is connected, in accordance with one embodiment of the present invention.

Figure 4:
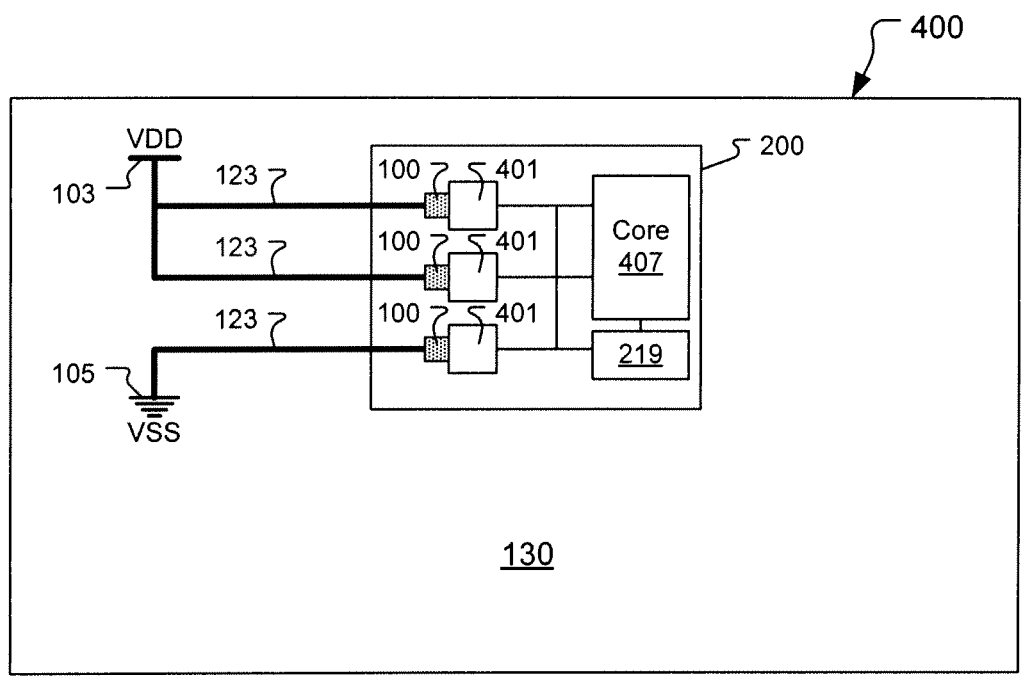
FIG. 4 shows a memory system that includes the die connected to the substrate, in which the die includes continuity test circuitry for each of its boundary pads, in accordance with one embodiment of the present invention.

FIG. 4 shows a memory system 400 that includes the die 200 connected to the substrate 130, in which the die 200 includes continuity test circuitry 401 for each of its boundary pads 100, in accordance with one embodiment of the present invention. The substrate 130 includes the number of wire bonds 123. Some of the wire bonds 123 are electrically connected to the second power supply 103 on the substrate, and some of the wire bonds 123 are electrically connected to the second reference ground potential 105. The die 200 includes a number of boundary pads 100. The die 200 is secured to the substrate 130 such that the number of boundary pads 100 are electrically and respectively connected to the number of wire bonds 123. The die 200 includes continuity test circuitry 401 for each boundary pad 100. The continuity test circuitry 401 for a given boundary pad 100 is defined to enable firmware 219 controlled testing of electrical continuity between the given boundary pad 100 and its wire bond 123. It should be understood that when the die 200 is secured to the substrate 130, the number of boundary pads 100 are not physically accessible from outside the memory system 400.

The continuity test circuitry 401 for each boundary pad 100 includes the pull-up transistor 201, the pull-up control multiplexer 211, the pull-down transistor 205, the pull-down control multiplexer 213, the output control multiplexer 215, the continuity test output conductor 209, the normal output conductor 107, the continuity testing enable register 217, the firmware 219, and their respective electrical connections as described with regard to each of FIGS. 2A and 3A. Therefore, the continuity test circuitry 401 is defined to test electrical continuity between a given boundary pad 100 and its wire bond 123 without disrupting an expected signal transmission from the given boundary pad 100 to a core 407 of the die 200.

In one embodiment, the signals used to operate the continuity test circuitry 401 are programmable through a central processing unit of a host device to which the memory system 400 is connected. Specifically, each of the pull-up transistor test control signal (pu_n_fw), the pull-down transistor test control signal (pd_n_fw), the output override signal (cout_override_fw), and the operation control signal (bypass_en) can be programmed in a respective register through the host device to which the memory system 400 is connected. In this embodiment, the host device can send a command to the firmware 219 to initiate the continuity testing, i.e., to set the operation control signal (bypass_en) in the continuity testing enable register 217 to the high digital state (1). Also in this embodiment, the host can direct the firmware 219 to perform the continuity testing on each boundary pad 100, i.e., to poll each boundary pad 100, and check the continuity status of each boundary pad 100.

Figure 5:
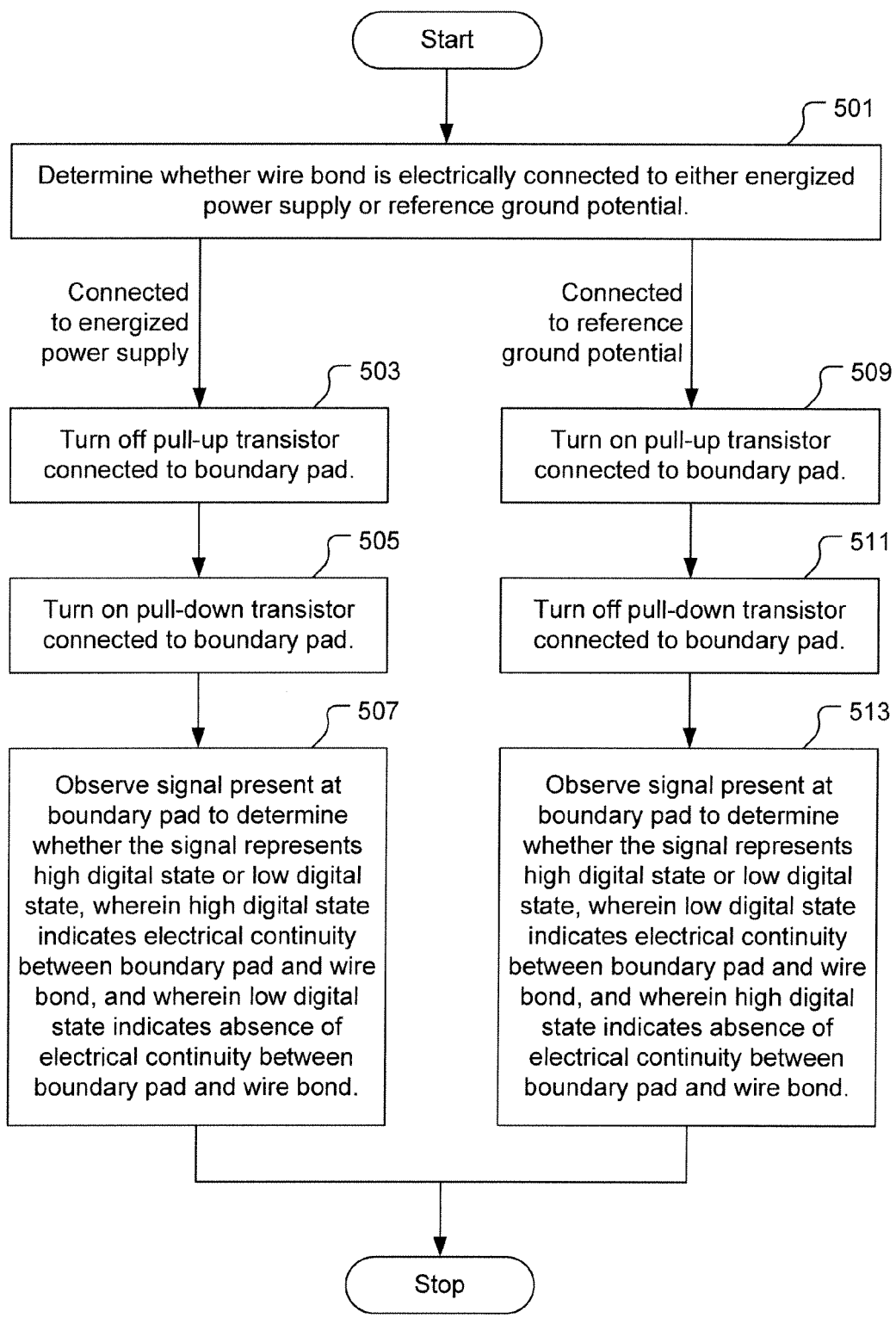
FIG. 5 shows a flowchart of a method for testing electrical continuity between a boundary pad and a wire bond, in accordance with one embodiment of the present invention.

FIG. 5 shows a flowchart of a method for testing electrical continuity between a boundary pad 100 and a wire bond 123, in accordance with one embodiment of the present invention. The method includes an operation 501 for determining whether the wire bond 123 is electrically connected to either an energized power supply 103 or a reference ground potential 105. If the wire bond 123 is connected to the energized power supply 103, the method proceeds with an operation 503 for turning off a pull-up transistor 201 connected to the boundary pad 100. An operation 505 is also performed to turn on a pull-down transistor 205 connected to the boundary pad 100. It should be understood that operations 503 and 505 can be performed in a substantially simultaneous manner. Then, an operation 507 is performed to observe a signal present at the boundary pad 100 to determine whether the signal represents a high digital state or a low digital state. Observation of the high digital state in operation 507 indicates electrical continuity between the boundary pad 100 and the wire bond 123. Observation of the low digital state in operation 507 indicates an absence of electrical continuity between the boundary pad 100 and the wire bond 123.

With reference back to operation 501, if the wire bond 123 is connected to the reference ground potential 105, the method proceeds with an operation 509 for turning on the pull-up transistor 201 connected to the boundary pad 100. An operation 511 is also performed to turn off the pull-down transistor 205 connected to the boundary pad 100. It should be understood that operations 509 and 511 can be performed in a substantially simultaneous manner. Then, an operation 513 is performed to observe a signal present at the boundary pad 100 to determine whether the signal represents a high digital state or a low digital state. Observation of the low digital state in operation 513 indicates electrical continuity between the boundary pad 100 and the wire bond 123. Observation of the high digital state in operation 513 indicates an absence of electrical continuity between the boundary pad 100 and the wire bond 123.

In the method of FIG. 5, turning on the pull-up transistor 201 connected to the boundary pad 100 causes the boundary pad 100 to be electrically connected with a continuity testing power supply 203. Also, turning off the pull-up transistor 201 connected to the boundary pad 100 causes the boundary pad 100 to be electrically isolated from the continuity testing power supply 203. Additionally, in the method of FIG. 5, turning on the pull-down transistor 205 connected to the boundary pad 100 causes the boundary pad 100 to be electrically connected with a continuity testing reference ground potential 207. Also, turning off the pull-down transistor 205 connected to the boundary pad 100 causes the boundary pad 100 to be electrically isolated from the continuity testing reference ground potential 207.

The method of FIG. 5 can also include an operation for electrically isolating the boundary pad 100 from core circuitry 407 to which the boundary pad 100 is normally connected. In one embodiment, a signal expected from the boundary pad 100 during normal operation is transmitted to the core circuitry 407 when the boundary pad 100 is electrically isolated from the core circuitry 407. Additionally, the method of FIG. 5 can include an operation for buffering the signal present at the boundary pad 100 prior to observing the signal present at the boundary pad 100 in operations 507 and 513 to determine whether the signal represents a high digital state or a low digital state.

It should be understood that the continuity test circuitry, dies, substrates, memory systems, memory components, memory chips, memory controller, etc., as discussed herein, can include additional circuitry and components that are not described herein to avoid unnecessarily obscuring the present invention. Also, it should be understood that the continuity test circuitry disclosed herein is defined to be compatible and interface with the additional circuitry of the various dies, substrates, memory systems, memory components, memory chips, memory controller, etc. Furthermore, it should be appreciated that the continuity test circuitry of the embodiments disclosed herein can be efficiently implemented in existing memory systems.

In one embodiment, the continuity test circuitry described herein can be embodied as computer readable code on a computer readable medium. For example, the computer readable code can include a layout data file within which one or more layouts corresponding to the continuity test circuitry are stored. The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the continuity test circuitry as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A continuity test circuit for a boundary pad, comprising:
   a pull-up transistor electrically connected between the boundary pad and a first power supply;
   a pull-down transistor electrically connected between the boundary pad and a first reference ground potential;
   a normal output conductor electrically connected to have a same electrical state as the boundary pad during normal operation;
   a continuity test output conductor electrically connected to have a same electrical state as the boundary pad during continuity test operation; and
   continuity testing control circuitry defined to control the pull-up transistor, the pull-down transistor, and the normal output conductor during continuity test operation such that an electrical state present on the continuity test output conductor indicates a status of electrical continuity between the boundary pad and either a second power supply or a second reference ground potential to which the boundary pad should be electrically connected.

2. A continuity test circuit for a boundary pad as recited in claim 1, wherein the boundary pad is electrically connected through the pull-up transistor to the first power supply when the pull-up transistor is on.

3. A continuity test circuit for a boundary pad as recited in claim 1, wherein the boundary pad is electrically connected through the pull-down transistor to the first reference ground potential when the pull-down transistor is on.

4. A continuity test circuit for a boundary pad as recited in claim 1, wherein the first and second power supplies are equivalent.

5. A continuity test circuit for a boundary pad as recited in claim 1, wherein the first and second power supplies are different.

6. A continuity test circuit for a boundary pad as recited in claim 1, wherein the continuity testing control circuitry includes a pull-up control multiplexer defined to control a gate of the pull-up transistor in accordance with an operation control signal, and
   wherein the continuity testing control circuitry includes a pull-down control multiplexer defined to control a gate of the pull-down transistor in accordance with the operation control signal, and
   wherein the continuity testing control circuitry includes an output control multiplexer defined to persist a normal operation output signal to the normal output conductor in accordance with the operation control signal.

7. A continuity test circuit for a boundary pad as recited in claim 6, wherein each of the pull-up, pull-down, and output control multiplexers is defined to include a respective select input electrically connected to a continuity testing enable register, wherein the operation control signal is set within the continuity testing enable register to indicate either a normal operation mode or a continuity test operation mode.

8. A continuity test circuit for a boundary pad as recited in claim 7, wherein the pull-up control multiplexer is defined to have a first input connected to receive a pull-up transistor normal control signal and a second input connected to receive a pull-up transistor test control signal, wherein the pull-up control multiplexer further includes an output electrically connected to the gate of the pull-up transistor, such that when the operation control signal indicates normal operation mode the pull-up transistor normal control signal is transmitted by the pull-up control multiplexer to the gate of the pull-up transistor, and such that when the operation control signal indicates continuity test operation mode the pull-up transistor test control signal is transmitted by the pull-up control multiplexer to the gate of the pull-up transistor.

9. A continuity test circuit for a boundary pad as recited in claim 8, wherein each of the pull-up transistor normal control signal and the pull-up transistor test control signal is generated through firmware.

10. A continuity test circuit for a boundary pad as recited in claim 7, wherein the pull-down control multiplexer is defined to have a first input connected to receive a pull-down transistor normal control signal and a second input connected to receive a pull-down transistor test control signal, wherein the pull-down control multiplexer further includes an output electrically connected to the gate of the pull-down transistor, such that when the operation control signal indicates normal operation mode the pull-down transistor normal control signal is transmitted by the pull-down control multiplexer to the gate of the pull-down transistor, and such that when the operation control signal indicates continuity test operation mode the pull-down transistor test control signal is transmitted by the pull-down control multiplexer to the gate of the pull-down transistor.

11. A continuity test circuit for a boundary pad as recited in claim 10, wherein each of the pull-down transistor normal control signal and the pull-down transistor test control signal is generated through firmware.

12. A continuity test circuit for a boundary pad as recited in claim 7, wherein the output control multiplexer is defined to have a first input connected to receive the electrical state present at the boundary pad and a second input connected to receive an output override signal, wherein an output of the output control multiplexer is electrically connected to the normal output conductor, such that when the operation control signal indicates normal operation mode the electrical state present at the boundary pad is transmitted by the output control multiplexer to the normal output conductor, and such that when the operation control signal indicates continuity test operation mode the output override signal is transmitted by the output control multiplexer to the normal output conductor.

13. A continuity test circuit for a boundary pad as recited in claim 12, wherein the output override signal is generated through firmware.

14. A continuity test circuit for a boundary pad as recited in claim 12, wherein the output override signal is set to indicate a high digital state when the boundary pad should be electrically connected to the second power supply, and wherein the output override signal is set to indicate a low digital state when the boundary pad should be electrically connected to the second reference ground potential.

15. A continuity test circuit for a boundary pad as recited in claim 12, further comprising:
a buffer having an input and an output, wherein the first input of the output control multiplexer is electrically connected to the output of the buffer, and wherein the input of the buffer is electrically connected to the boundary pad.

16. A continuity test circuit for a boundary pad as recited in claim 15, wherein the continuity test output conductor is electrically connected to the output of the buffer.

17. A memory system, comprising:
a substrate including a number of wire bonds;
a die including a number of boundary pads, wherein the die is secured to the substrate such that the number of boundary pads are electrically and respectively connected to the number of wire bonds, wherein the die includes continuity test circuitry for each boundary pad, the continuity test circuitry for a given boundary pad defined to enable firmware controlled testing of electrical continuity between the given boundary pad and its wire bond.

18. A memory system as recited in claim 17, wherein the number of boundary pads are not physically accessible from outside the memory system.

19. A memory system as recited in claim 17, wherein the continuity test circuitry is defined to test electrical continuity between the given boundary pad and its wire bond without disrupting an expected signal transmission from the given boundary pad to a core of the die.

20. A memory system as recited in claim 17, wherein the continuity test circuitry for a given boundary pad includes,
a pull-up transistor electrically connected between the given boundary pad and a first power supply,
a pull-down transistor electrically connected between the given boundary pad and a first reference ground potential,
a normal output conductor electrically connected to have a same electrical state as the given boundary pad during normal operation,
a continuity test output conductor electrically connected to have a same electrical state as the given boundary pad during continuity test operation, and
continuity testing control circuitry defined to control the pull-up transistor, the pull-down transistor, and the normal output conductor during continuity test operation such that an electrical state present on the continuity test output conductor indicates a status of electrical continuity between the given boundary pad and its wire bond.

21. A memory system as recited in claim 20, wherein the wire bond is electrically connected to either a power supply on the substrate or a reference ground potential on the substrate.

22. A method for testing electrical continuity between a boundary pad and a wire bond, comprising:
determining whether the wire bond is electrically connected to either an energized power supply or a reference ground potential;
if the wire bond is connected to the energized power supply, turning off a pull-up transistor connected to the boundary pad, and turning on a pull-down transistor connected to the boundary pad, and observing a signal present at the boundary pad to determine whether the signal represents a high digital state or a low digital state,
wherein the high digital state indicates electrical continuity between the boundary pad and the wire bond, and wherein the low digital state indicates an absence of electrical continuity between the boundary pad and the wire bond; and
if the wire bond is connected to the reference ground potential, turning on the pull-up transistor connected to the boundary pad, and turning off the pull-down transistor connected to the boundary pad, and observing the signal present at the boundary pad to determine whether the signal represents the high digital state or the low digital state, wherein the low digital state indicates electrical continuity between the boundary pad and the wire bond, and wherein the high digital state indicates an absence of electrical continuity between the boundary pad and the wire bond.

23. A method for testing electrical continuity between a boundary pad and a wire bond as recited in claim 22, further comprising:
electrically isolating the boundary pad from core circuitry to which the boundary pad is normally connected.

24. A method for testing electrical continuity between a boundary pad and a wire bond as recited in claim 23, further comprising:
transmitting a signal expected from the boundary pad during normal operation to the core circuitry when the boundary pad is electrically isolated from the core circuitry.

25. A method for testing electrical continuity between a boundary pad and a wire bond as recited in claim 22, wherein turning on the pull-up transistor connected to the boundary pad causes the boundary pad to be electrically connected with a continuity testing power supply, and wherein turning off the pull-up transistor connected to the boundary pad causes the boundary pad to be electrically isolated from the continuity testing power supply, and
wherein turning on the pull-down transistor connected to the boundary pad causes the boundary pad to be electrically connected with a continuity testing reference ground potential, and wherein turning off the pull-down transistor connected to the boundary pad causes the boundary pad to be electrically isolated from the continuity testing reference ground potential.

26. A method for testing electrical continuity between a boundary pad and a wire bond as recited in claim 22, further comprising:
buffering the signal present at the boundary pad prior to observing the signal present at the boundary pad to determine whether the signal represents the high digital state or the low digital state.

* * * * *